(12) United States Patent
Kirchoff et al.

(10) Patent No.: US 9,038,949 B2
(45) Date of Patent: May 26, 2015

(54) RADIO FREQUENCY SHIELDING SYSTEM

(71) Applicant: The Boeing Company, Chicago, IL (US)

(72) Inventors: Kenneth P. Kirchoff, Redmond, WA (US); Patrick M. Njeim, Mukilteo, WA (US); Thomas K. Morrow, Kirkland, WA (US); Joel J. Peterson, Snohomish, WA (US); Michael R. Sirkis, Everett, WA (US); Ryan L. Carlson, Auburn, WA (US); Bruce J. Donham, Bothell, WA (US); Jim Sears, Gig Harbor, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/270,302

(22) Filed: May 5, 2014

(65) Prior Publication Data
US 2014/0284425 A1    Sep. 25, 2014

Related U.S. Application Data

(62) Division of application No. 11/812,300, filed on Jun. 18, 2007, now Pat. No. 8,800,926.

(51) Int. Cl.
*B64C 1/14* (2006.01)
*H05K 9/00* (2006.01)
*B64D 45/00* (2006.01)

(52) U.S. Cl.
CPC ............ *B64C 1/1484* (2013.01); *B64C 1/1492* (2013.01); *B64D 2045/006* (2013.01); *H05K 9/0018* (2013.01)

(58) Field of Classification Search
CPC ...... B64C 1/1492; B64C 1/1484; B64C 7/00; B64C 43/00; B64C 29/06; B64C 1/1446; G06F 1/182; H05K 9/0016; H04B 7/18506; H04W 84/06; E06B 1/30; B21D 53/00; Y02B 80/24
USPC ................. 244/129.3, 129.4, 129.1; 361/818; 455/431, 430
See application file for complete search history.

(56) References Cited

U.S. PATENT DOCUMENTS 3,906,669 A * 9/1975 Vorguitch ........................ 49/372
4,364,533 A * 12/1982 Pompei et al. ............. 244/129.3

(Continued)

FOREIGN PATENT DOCUMENTS

EP    0413580    2/1991
EP    1478106    11/2004

(Continued)

OTHER PUBLICATIONS

PCT/US2006/046155 International Search Report dated Mar. 12, 2007.

*Primary Examiner* — Tien Dinh
*Assistant Examiner* — Assres H Woldemaryam (57) ABSTRACT

An assembly for shielding an aircraft from electromagnetic energy may include a window mounting configured to be conductively coupled to an aperture in a fuselage of an aircraft. The window mounting may include a window pane having an electromagnetically-reflective coating for reflecting electromagnetic energy. The window pane may remain electrically isolated from the fuselage prior to the electromagnetic energy exceeding a frequency of approximately 1 GHz. The window mounting may further include a capacitive gasket capacitively coupling the window pane to the fuselage after the frequency of the electromagnetic energy reflected by the window pane exceeds approximately 1 GHz.

20 Claims, 8 Drawing Sheets

(56) References Cited

U.S. PATENT DOCUMENTS

| | | | |
|---|---|---|---|
| 4,541,595 A * | 9/1985 | Fiala et al. | 244/129.3 |
| 4,793,108 A * | 12/1988 | Bain et al. | 52/208 |
| 5,147,694 A * | 9/1992 | Clarke | 428/34 |
| 5,174,066 A | 12/1992 | Dupuy | |
| 5,271,581 A * | 12/1993 | Irish | 244/129.3 |
| 5,358,787 A | 10/1994 | Fontana et al. | |
| 5,367,956 A | 11/1994 | Fogle, Jr. | |
| 5,488,371 A | 1/1996 | Targove | |
| 5,670,742 A | 9/1997 | Jones | |
| 5,855,972 A * | 1/1999 | Kaeding | 428/34 |
| 6,168,112 B1 * | 1/2001 | Mueller et al. | 244/129.3 |
| 6,561,460 B2 * | 5/2003 | Rukavina et al. | 244/129.3 |
| 6,719,293 B1 | 4/2004 | Coles et al. | |
| 6,787,204 B2 * | 9/2004 | Chaussade et al. | 428/34 |
| 6,793,182 B2 * | 9/2004 | Hopkins et al. | 244/129.3 |
| 6,864,315 B1 | 3/2005 | Hakuta et al. | |
| 6,921,859 B2 * | 7/2005 | Hikita et al. | 174/381 |
| 7,350,753 B2 | 4/2008 | Guidon et al. | |
| 8,889,218 B2 * | 11/2014 | Eberle et al. | 427/123 |
| 2002/0046849 A1 | 4/2002 | Rapp et al. | |
| 2003/0234322 A1 * | 12/2003 | Bladt et al. | 244/129.3 |
| 2004/0229607 A1 * | 11/2004 | La Chapelle et al. | 455/431 |
| 2005/0154132 A1 | 7/2005 | Hakuta et al. | |
| 2005/0200934 A1 * | 9/2005 | Callahan et al. | 359/265 |
| 2006/0038357 A1 * | 2/2006 | Kamibayashiyama | 277/594 |
| 2007/0045470 A1 * | 3/2007 | Guidon et al. | 244/129.3 |
| 2007/0137117 A1 * | 6/2007 | Carlson et al. | 52/204.1 |
| 2008/0308677 A1 * | 12/2008 | Kirchoff et al. | 244/129.3 |

FOREIGN PATENT DOCUMENTS

| | | |
|---|---|---|
| FR | 2793106 | 11/2000 |
| JP | 4411050292 | 7/1997 |
| WO | WO2007064974 | 6/2007 |

* cited by examiner

RADIO FREQUENCY SHIELDING SYSTEM

CROSS-REFERENCE TO RELATED APPLICATIONS

The present application is a divisional application of and claims priority to pending U.S. application Ser. No. 11/812,300 filed on Jun. 18, 2007, and entitled RADIO FREQUENCY SHIELDING APPARATUS SYSTEM AND METHOD, the entire contents of which is expressly incorporated by reference herein.

BACKGROUND

The present disclosure generally relates to radio frequency shielding for a commercial aircraft. More particularly, the disclosure pertains to a method and system that assists in attenuating electromagnetic propagation through commercial aircraft passenger windows, aircraft doors or the like.

BACKGROUND

Generally, the fuselage of commercial aircraft are extremely efficient at attenuating electromagnetic radiation or energy such as radio frequency (RF) energy. Conventional aircraft typically include an outer skin of aluminum or include a conductive mesh or coating to dissipate lightning strikes. This conductive skin reflects and attenuates RF energy to a high degree. However, commercial aircraft generally also include a number of electromagnetic apertures. Aircraft windows and doors are two of the most common electromagnetic apertures inherent to most commercial aircraft designs. During operation of commercial aircraft, these apertures allow RF energy to enter and exit the aircraft.

This property of aircraft windows and doors is undesirable for several reasons. For example, externally generated RF transmissions may interfere with on-board systems. In another example, internally generated RF transmissions may interfere with on-board systems and/or may violate the rules of the United States Federal Communications Commission (FCC) and other such regulatory institutions.

Accordingly, it is desirable to provide a cost effective method and apparatus for attenuating electromagnetic propagation through aircraft passenger windows or the like at least to some extent.

SUMMARY

The foregoing needs are met, at least to some extent, by the present disclosure, wherein in one respect a system, assembly, and method is provided that in some embodiments attenuates electromagnetic propagation through an aperture in an aircraft.

An embodiment relates to a system for shielding an aircraft from electromagnetic energy. The system includes a fuselage, aperture, window mounting, and window plug. The fuselage provides an electrically conductive envelope. The aperture is disposed in the fuselage. The window mounting spans the aperture. The window plug spans the aperture. The window mounting and the window plug are electrically coupled to the fuselage and provide an electrical path spanning the aperture.

Another embodiment pertains to an assembly for shielding an aperture in a fuselage of an aircraft from electromagnetic energy. The assembly includes a window mounting and a window plug. The window mounting spans the aperture. The window plug spans the aperture. The window mounting and the window plug are electrically coupled to the fuselage and provide an electrical path spanning the aperture.

Yet another embodiment relates to a method of shielding an aperture in a fuselage of an aircraft from electromagnetic energy. In this method, a window mounting is conductively connected to the fuselage and a window plug is conductively connected to the window mounting.

There has thus been outlined, rather broadly, certain embodiments that the detailed description thereof herein may be better understood, and in order that the present contribution to the art may be better appreciated. There are, of course, additional embodiments that will be described below and which will form the subject matter of the claims appended hereto.

In this respect, before explaining at least one embodiment in detail, it is to be understood that embodiments are not limited in its application to the details of construction and to the arrangements of the components set forth in the following description or illustrated in the drawings. In addition to the embodiments described, the various embodiments are capable of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the disclosure. It is important, therefore, that the claims be regarded as including such equivalent constructions insofar as they do not depart from the spirit and scope of the various embodiments.

DETAILED DESCRIPTION

Various embodiments will now be described with reference to the drawing figures, in which like reference numerals refer to like parts throughout. An embodiment in accordance with the present disclosure provides a method and system that assists in attenuating electromagnetic propagation, for example RF energy, through commercial aircraft apertures such as passenger windows, aircraft doors or the like. More particularly, an embodiment provides an aircraft aperture assembly or system having a plurality of components that, when assembled in an aircraft frame or fuselage, assists in the attenuation of the transmission of RF energy therethrough.

Figure 1:
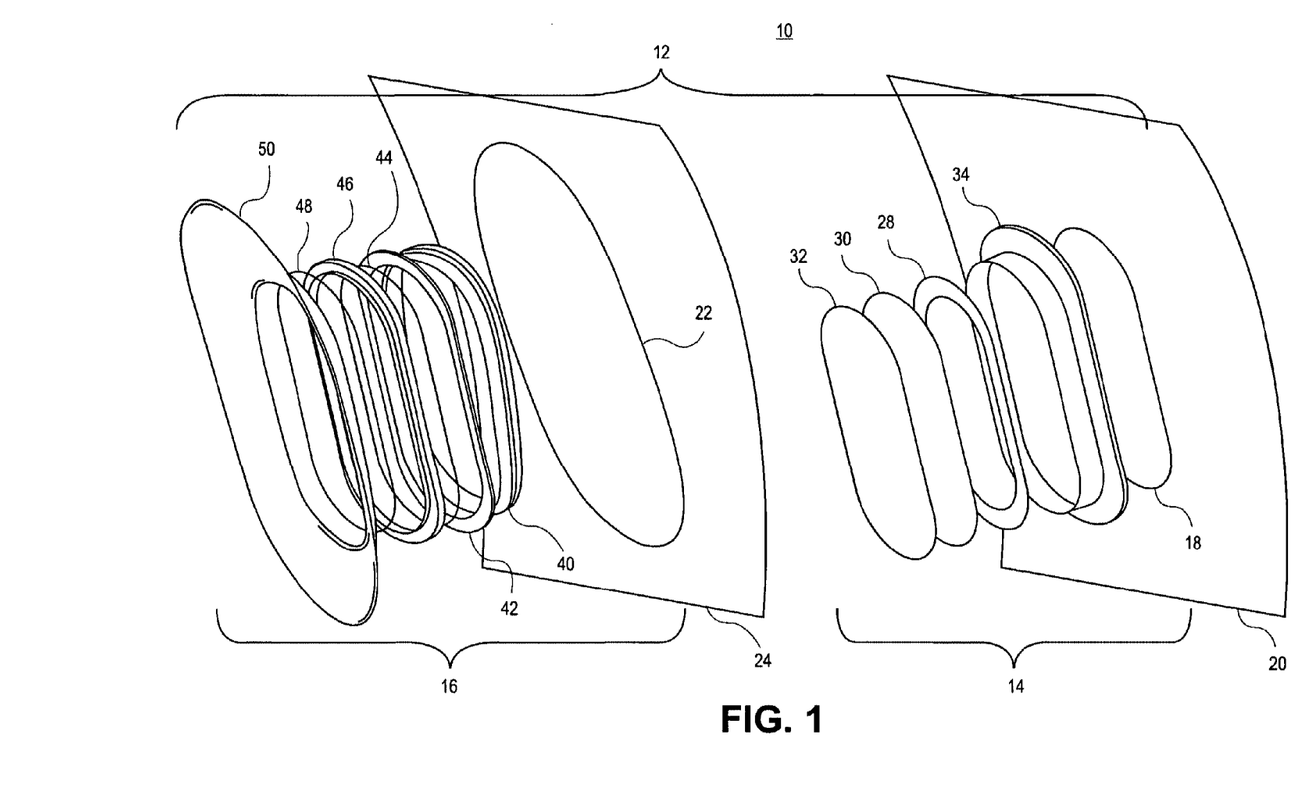
FIG. 1 is an exploded view of a system for shielding an aperture according to an embodiment.

Referring now to FIG. 1, a window system 10 includes a window mounting 14 and window plug 16. The window mounting 14 is configured to be mounted in or mated with a window opening 18 in an outer skin 20 of an aircraft (not shown). The window plug 16 is configured to be mounted in or mated with a plug opening 22 in an inner skin 24 of the aircraft. The window mounting 14 includes a capacitive gasket 28, outer window 30, inner window 32, and window forging 34. The window mounting 14 is further described in FIGS. 2 and 3. The window plug 16 includes a bellows seal 40, outer reveal 42, electronically dimmable window (EDW) 44, inner reveal 46, dust cover 48, and window plug molding 50.

In general, some or all of the various components of the window system 10 are configured to conduct electricity sufficiently well enough to reflect and/or attenuate electromagnetic energy such as RF energy. More particularly, when installed in an electrically conductive envelope such as a fuselage of an aircraft, the assembled components of the window system 10 provide a conductive path spanning the window opening 18 in the outer skin 20 of the fuselage. In this manner, electromagnetic energy such as RF energy generated within the fuselage may be attenuated or essentially prevented, to a large extent, from entering or exiting the fuselage. It is an advantage of various embodiments that RF energy may be attenuated to such an extent that signals emanating from within the fuselage can not reasonably be detected outside the fuselage. It is another advantage of various embodiments that, for the purposes of the United States Federal Communications Commission (FCC) and other such regulatory institutions, the interior of an aircraft outfitted with the window system 10 may be classified an indoor environment due to the attenuation of RF energy provided by the window system 10.

Figure 2:
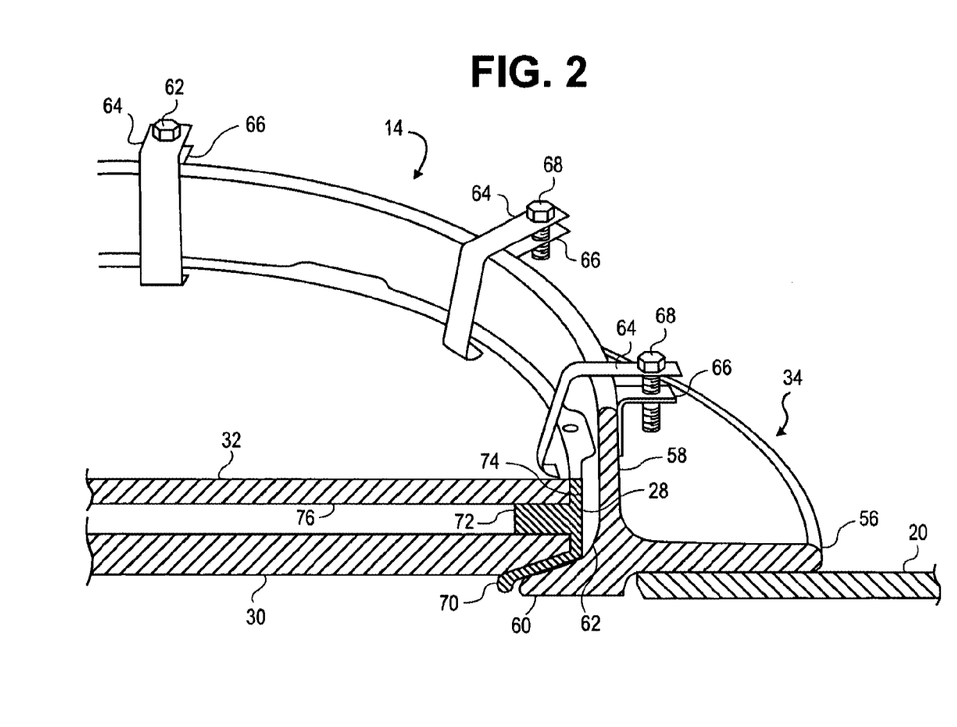
FIG. 2 is a cross-sectional perspective view of a window mounting suitable for use with the system according to FIG. 1.

In FIG. 2, a particular embodiment of the commercial aircraft window mounting, generally designated 14, is illustrated. The commercial aircraft window mounting 14 includes the capacitive gasket 28 positioned between and/or partially surrounding the outer window 30 and the inner window 32. The commercial aircraft mounting 14 additionally includes the window forging 34 that is configured to mate with the airframe or outer skin 20 of the aircraft. The window forging 34 includes a radial flange 56 and an axial flange 58. The window forging 18 also includes a base portion 60 that extends in opposing relationship to the radial flange 56. That is, the base portion 60 extends generally inwardly or opposite the radial flange 56 as previously discussed, and provides an inwardly and downwardly sloping surface 62.

As illustrated in FIG. 2, the commercial aircraft window mounting 14 further includes a series of spring clips 64 positioned about the periphery of the window forging 34. The commercial aircraft window mounting 14 also has a series of mounting flanges 66 and a series of bolts 68, or other such mechanical attachments or fasteners, also positioned about the periphery of the forging 34. The mounting flanges 66 are connected to, and extend from, the axial flange 58 of the window forging 34. The mounting flanges 66 are positioned about the periphery of the window forging 34 as illustrated in FIG. 1, and combine with the spring clips 64 and the bolts 34 to mount the gasket 28 and outer and inner windows 30, 32 to the window forging 34.

Figure 3:
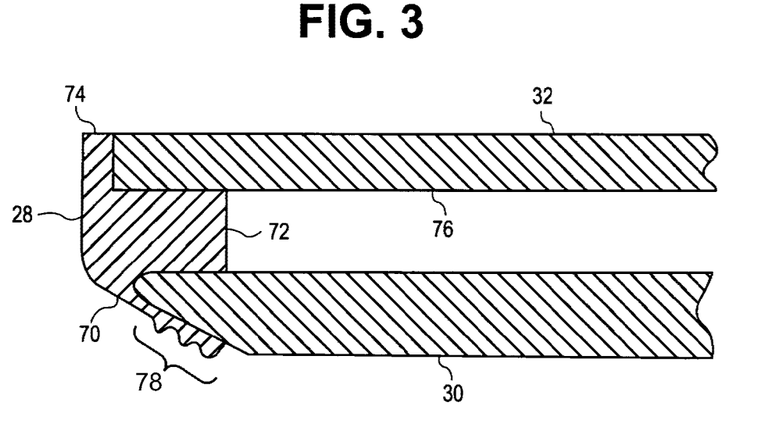
FIG. 3 is a cross-sectional view of a capacitive gasket suitable for use with the window mounting according to FIG. 2.

Referring now to FIGS. 2 and 3, a cross-sectional view of the gasket 28 is illustrated. As depicted in FIGS. 2 and 3, the gasket 28 encircles the outer window 30 and inner window 32 and provides a circumferential bond between the outer and inner windows 30, 32 and the window forging 34. The gasket 28 is a capacitive gasket that provides a capacitive bond between the windows 30, 32 and the window forging 34. The gasket 28 includes a lower portion or section 70, a mid-section or portion 72 and an upper portion or section 74.

As illustrated in FIGS. 2 and 3, the lower section 70 of the gasket 28 extends from the mid-section 72 of the gasket 28 at an angle in a downwardly direction, away for the window forging 34. The aforementioned geometry of the lower section 70 of the gasket 28 generally mirrors or compliments the downwardly sloping surface 62 of the base portion 60. The lower section 70 includes a series of ridges, generally designated 78, that extend outwardly from the lower section 70. As depicted in FIGS. 2 and 3, the mid-section 72, as the name suggests, occupies the middle portion of the gasket 28 and functions as a spacer between the outer window 30 and inner window 32. The upper portion 74 extends upwardly from the mid-section 72, generally parallel to the axial flange 58 of the window forging 34.

In various embodiments, the gasket 28 includes a conductive media that is bound by an elastomeric matrix. The conductive media includes any suitable strongly, weakly, and/or semi-conductive materials. Specific examples of conductive materials include conductive carbon black, aluminum, silver, and the like. The elastomeric matrix includes ethylene propylene diene monomer (EPDM) and the like. In one embodiment, the capacitive gasket 28 includes a carbon black media in an EPDM or other such elastomeric matrix. Alternatively, the gasket 28 may include silver and/or aluminum flakes in an EPDM or other such elastomeric matrix. The carbon black media provides greater than 20 dB to about 45 dB of RF energy shielding in the range of from about 80 MHz to approximately 18 GHz of the electromagnetic spectrum. The silver and/or aluminum flake media provides approximately 10 dB to about 47 dB of RF energy shielding in the range of from about 80 MHz to approximately 18 GHz of the electromagnetic spectrum.

As previously discussed, during operation of commercial aircraft for example, the aircraft encounters electromagnetic energy in the form of RF radiation from external sources. This RF radiation can interfere with the operation of the commercial aircraft systems such as the communication system and the navigation system. Accordingly, in order to attenuate the propagation of RF radiation through the commercial aircraft passenger windows, techniques such as shielding are implemented to reduce electromagnetic propagation. During the shielding process and, prior to assembly of the window system 10 the windows are treated with a film or material that reflects electromagnetic energy. As illustrated in FIG. 1, the inner window 32 has been shielded or treated, as generally designated by reference numeral 76, with a film or other material that reduces or attenuates the propagation of electromagnetic radiation. The shielding 76 includes any suitable film, layer, and/or treatment operable to reflect, attenuate, or otherwise reduce the propagation of electromagnetic energy. Suitable examples of the shielding 76 include conductive films, meshes, and the like.

The shielded inner window 32 combines with the gasket 28 to reduce electromagnetic propagation through the passenger windows of a commercial aircraft. As previously discussed, the shielded window 32 reflects electromagnetic radiation, however as the frequency of electromagnetic energy increases, for example, to approximately 1 GHz to approximately 2 GHz, the window may begin to lose its attenuation characteristics and begin to resonate and retransmit the electromagnetic energy. To avoid such instances, the gasket 28 provides a capacitive coupling between the inner window 32 and the commercial aircraft frame, dissipating the electromagnetic energy onto the aircraft frame or outer skin 20. In this regard, the gasket 28 includes a material having a dielectric constant, permittivity, and/or resistance such that the gasket 28 is configured to discharge electromagnetic energy from the window 32 to the window forging 34 prior to resonance of the window 32. That is, the window 32 is configured to reflect electromagnetic energy until the energy exceeds a predetermined maximum amount of energy. If the window 32 were to remain electrically isolated past this predetermined maximum amount of energy, the window 32 may transmit RF energy. The gasket 28 is configured to conduct electromagnetic energy or electricity from the window 32 to the window forging 34 prior to the amount of energy in the window 32 exceeding the predetermined maximum. The gasket 28 further assists the attenuation electromagnetic radiation by absorbing some of the electromagnetic energy as heat.

Figure 4:
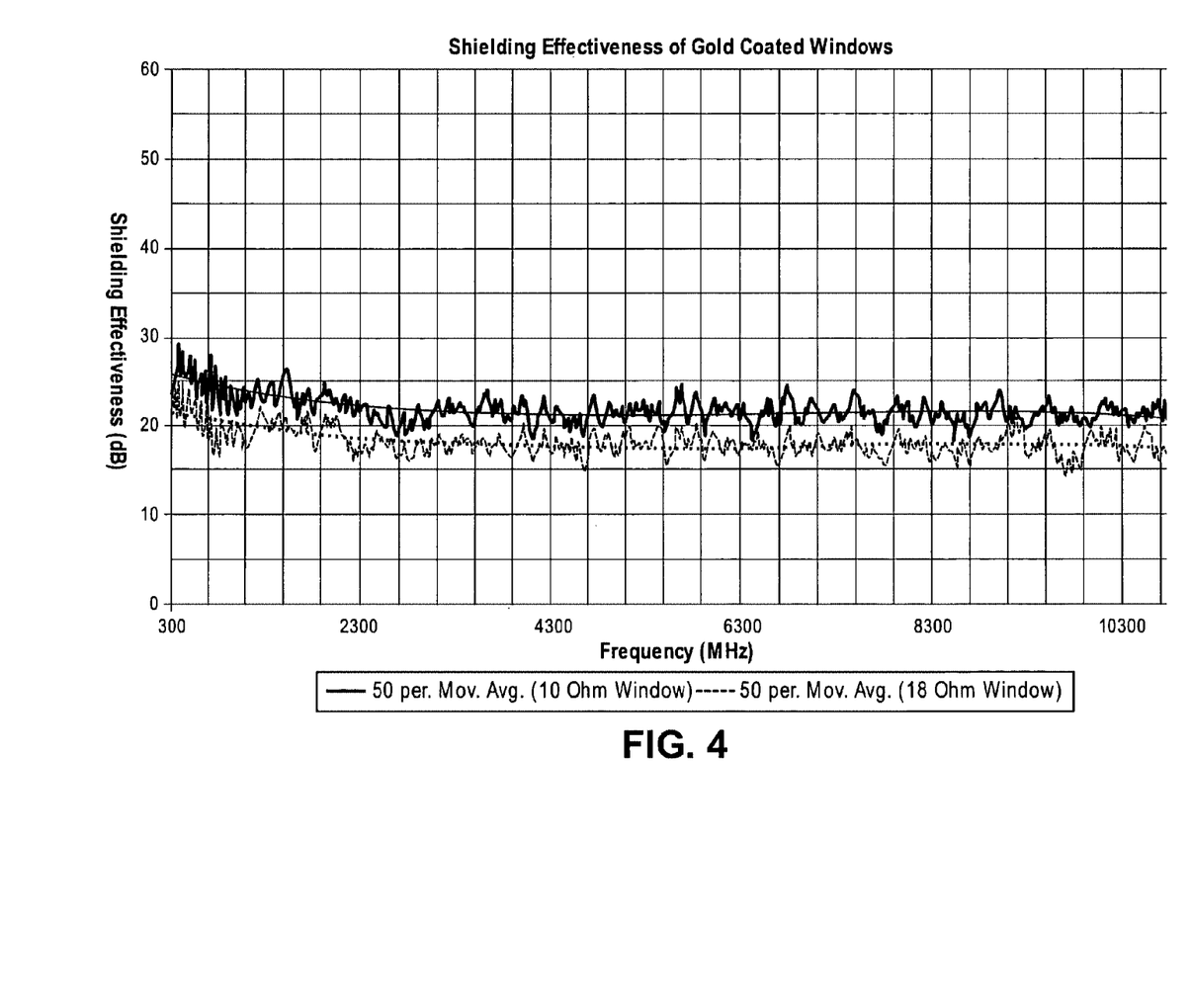
FIG. 4 is an example of a graph showing frequency in MHz (abscissa) as it affects the shielding effectiveness in dB (ordinate) of coated windows suitable for use with the system according to FIG. 1.
Figure 5:
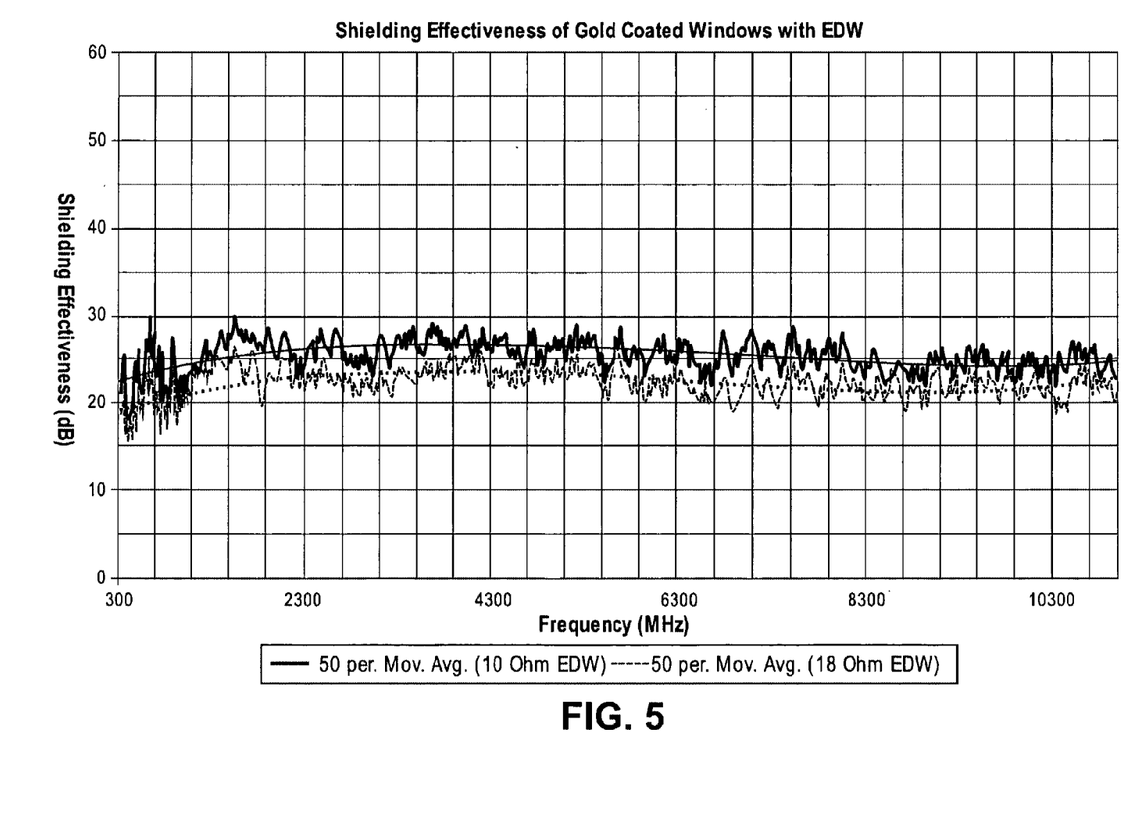
FIG. 5 is an example of a graph showing frequency in MHz (abscissa) as it affects the shielding effectiveness in dB (ordinate) of coated windows and electronically dimmable windows suitable for use with the system according to FIG. 1.
Figure 6:
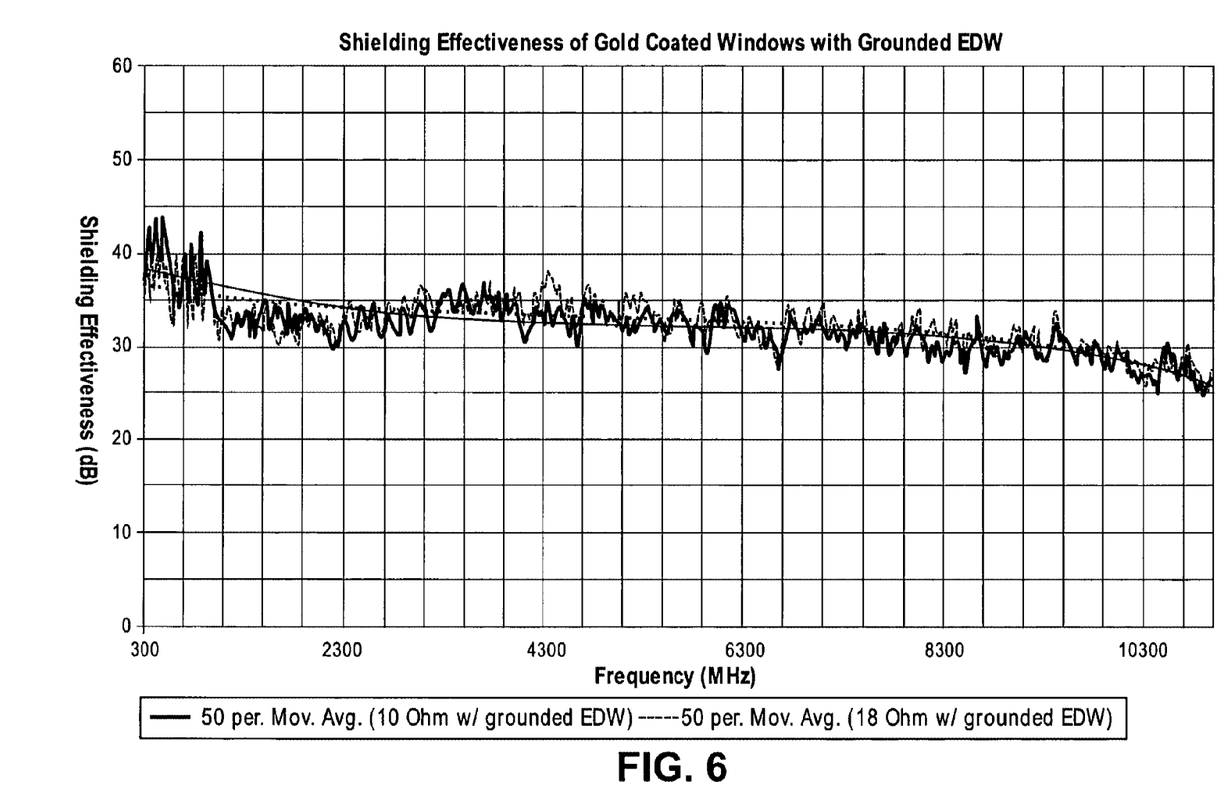
FIG. 6 is an example of a graph showing frequency in MHz (abscissa) as it affects the shielding effectiveness in dB (ordinate) of coated windows and grounded electronically dimmable windows suitable for use with the system according to FIG. 1.
Figure 7:
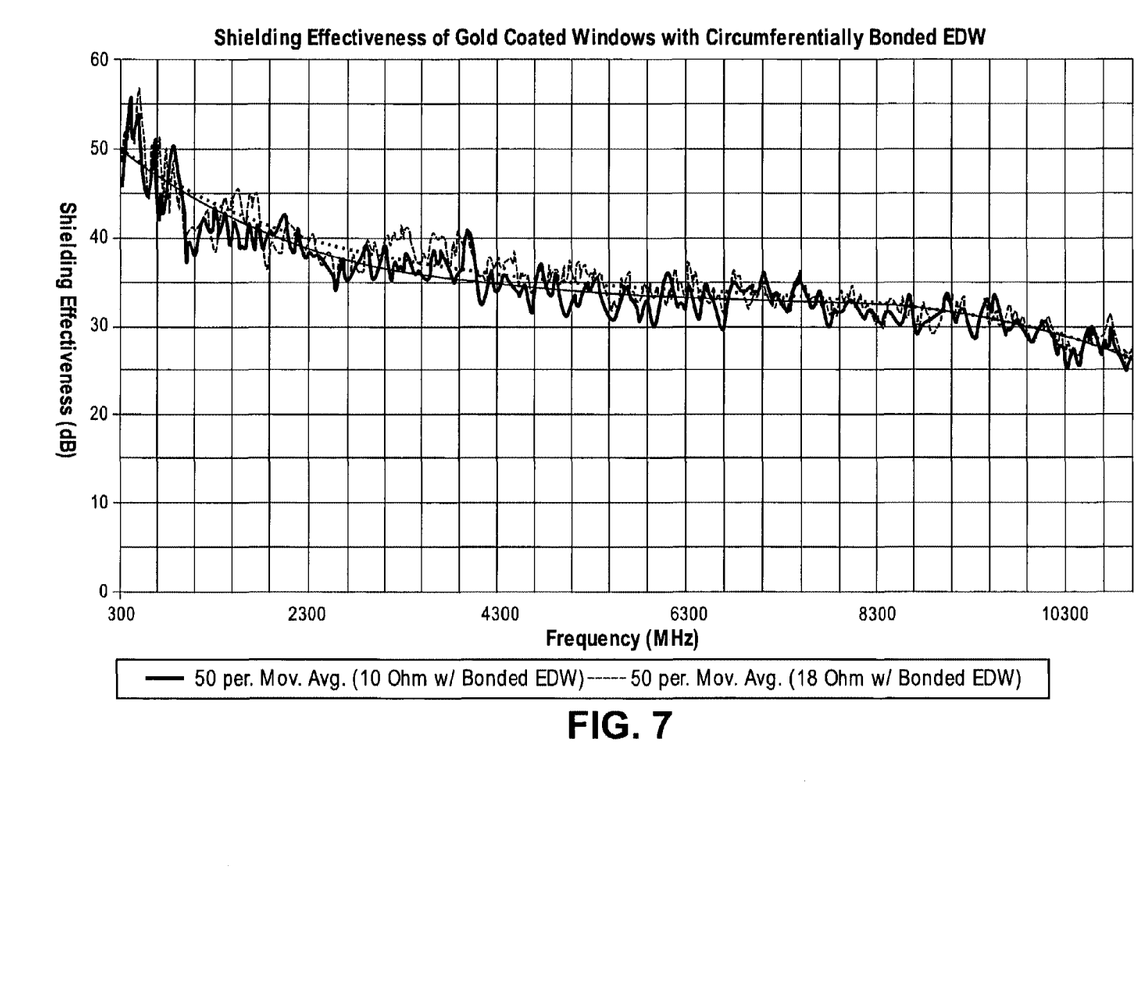
FIG. 7 is an example of a graph showing frequency in MHz (abscissa) as it affects the shielding effectiveness in dB (ordinate) of coated windows and circumferentially bonded electronically dimmable windows suitable for use with the system according to FIG. 1.

FIGS. 4-7 are examples of graphs showing frequency in MHz (abscissa) as it affects the shielding effectiveness in dB (ordinate) of components suitable for use with the system according to FIG. 1. As shown in FIG. 4, the window 30 and/or 32, when coated with a thin, essentially transparent, coating of gold, attenuates approximately 20 decibels (dB) of electromagnetic (EM) energy within a frequency range of about 300 megahertz (MHz) to about 11,000 MHz. As shown in FIG. 5, when the coated window 30 and/or 32 is combined with the EDW 44, approximately 25 dB of EM energy is attenuated within a frequency range of about 300 MHz to about 11,000 MHz. That is, assembling these two components increases the attenuation. Similarly, as shown in FIG. 6, by grounding the EDW 44, approximately 35 dB of EM energy is attenuated within a frequency range of about 300 MHz to about 11,000 MHz. The attenuation is further again increased by circumferentially bonding the EDW 44 within the window system 10. In a particular embodiment, the EDW 44 is circumferentially bonded to the window system 10 via the bellows seal 40. For example the bellows seal 40 is conductively coated or otherwise configured to conduct EM energy. In a particular example, the bellows seal 40 is coated with an electrically conductive silicone-based ink. This ink may include any suitable conductive material such as, for example, aluminum, silver, gold, carbon, and the like. While in general, any suitable coating material that exhibits good adhesion to the bellows seal 40, flexibility, and conductivity may be utilized in various embodiments, specific examples of coating materials may be manufactured by Creative Materials, Inc. of Tyngsboro, Mass. 01879, U.S.A. In particular, product number 115-08, electrically conductive silicone ink with 87% silver (cured) is suitable for use with various embodiments. It is to be understood that the graphs illustrated in FIGS. 4-7 are for illustrative purposes only, and thus, the respective curvatures, slopes and y-intercepts may be the same or different depending on the response of the various EM energy attenuators.

Figure 8:
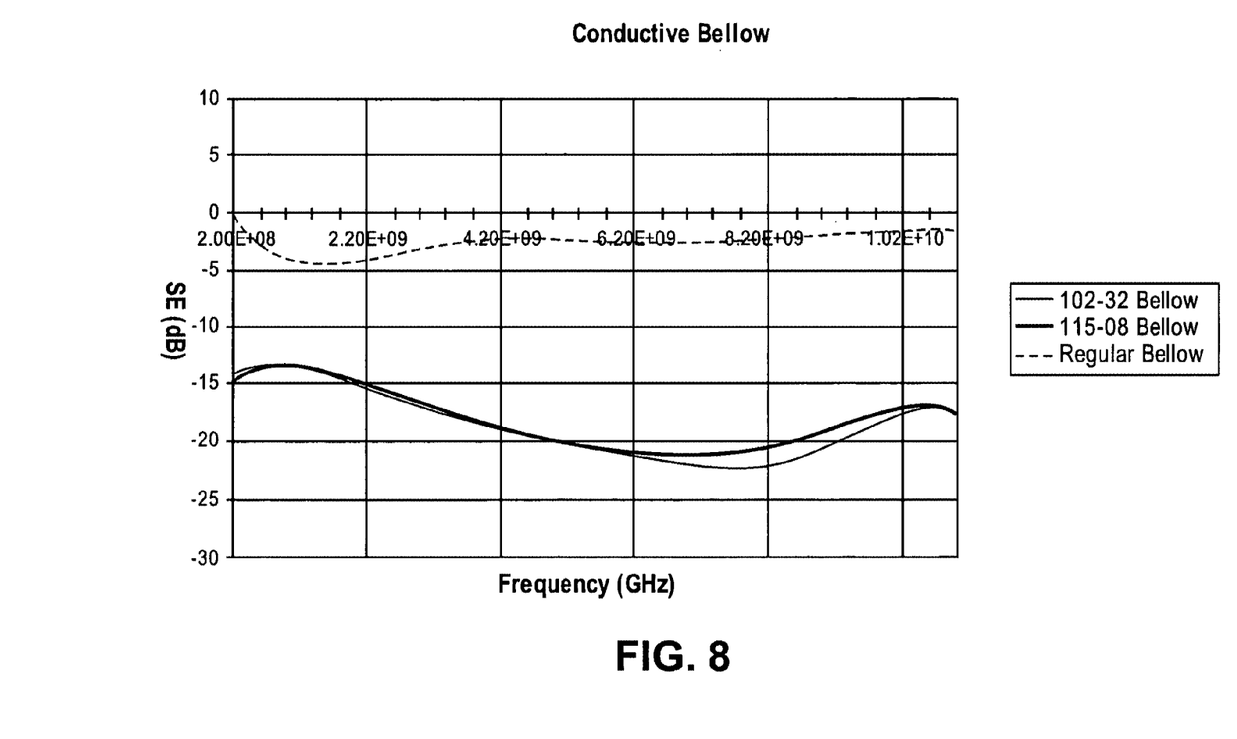
FIG. 8 is an example of a graph showing frequency in MHz (abscissa) as it affects the shielding effectiveness in dB (ordinate) of a coated bellows suitable for use with the system according to FIG. 1.

FIG. 8 is an example of a graph showing frequency in MHz (abscissa) as it affects the shielding effectiveness in dB (ordinate) of a coated bellows suitable for use with the system according to FIG. 1. As shown in FIG. 8, when coated with electrically conductive silicone ink with 87% silver (cured), the bellows seal 40 attenuates approximately 20 dB. It is to be understood that the graph illustrated in FIG. 8 is for illustrative purposes only, and thus, the respective curvatures, slopes and y-intercepts may be the same or different depending on the response of the various EM energy attenuators.

The many features and advantages of the various embodiments are apparent from the detailed specification, and thus, it is intended by the appended claims to cover all such features and advantages that fall within the true spirit and scope of the embodiments. Further, since numerous modifications and variations will readily occur to those skilled in the art, it is not desired to limit the embodiments to the exact construction and operation illustrated and described, and accordingly, all suitable modifications and equivalents may be resorted to, falling within the scope of the various embodiments.

What is claimed is:

1. An assembly for shielding an aircraft from electromagnetic energy, comprising:
    a window mounting configured to be conductively coupled to an aperture in a fuselage of an aircraft, the window mounting including:
        a window pane having an electromagnetically-reflective coating for reflecting electromagnetic energy, the window pane remaining electrically isolated from the fuselage prior to the electromagnetic energy exceeding a frequency of approximately 1 GHz; and
        a capacitive gasket capacitively coupling the window pane to the fuselage after the frequency of the electromagnetic energy reflected by the window pane exceeds approximately 1 GHz.

2. The assembly according to claim 1, wherein the window mounting further comprises:
    a window forging configured to conductively couple the window mounting to the fuselage.

3. The assembly according to claim 2, wherein:
    the capacitive gasket comprises an elastomeric matrix providing a seal between the window pane and the window forging.

4. The assembly according to claim 3, wherein:
    the capacitive gasket includes a conductive media for conducting electromagnetic energy from the window pane to the window forging.

5. The assembly according to claim 4, wherein:
    the conductive media comprises carbon black.

6. The assembly according to claim 1, wherein:
    the window mounting includes an electronically dimmable window.

7. The assembly according to claim 6, further comprising:
    a bellows seal mating the electronically dimmable window to the window mounting.

8. The assembly according to claim 7, wherein:
    the bellows seal includes an electrically conductive coating electrically coupling the electronically dimmable window to the window mounting.

9. The assembly according to claim 8, wherein the electrically conductive coating comprises:
    an electrically conductive silicone ink with 87% silver when cured.

10. The assembly according to claim 1, wherein the assembly attenuates greater than about 20 decibels (dB) of electromagnetic (EM) energy in a frequency range of from about 380 Mega Hertz (MHz) to about 10.6 Giga Hertz (GHz).

11. The assembly according to claim 10, wherein the assembly attenuates about 30 dB of EM energy in a frequency range of from about 380 MHz to about 10.6 GHz.

12. A system for shielding an aircraft from electromagnetic energy, the system comprising:
a fuselage providing an electrically conductive envelope;
an aperture disposed in the fuselage;
a window mounting mounted in the aperture of and conductively coupled to the fuselage, the window mounting including:
a window pane having an electromagnetically-reflective coating for reflecting electromagnetic energy, the window pane remaining electrically isolated from the fuselage prior to the electromagnetic energy exceeding a frequency of approximately 1 GHz; and
a capacitive gasket capacitively coupling the window pane to the fuselage after the frequency of the electromagnetic energy reflected by the window pane exceeds approximately 1 GHz.

13. The system according to claim 12, wherein the window mounting further comprises:
a window forging configured to conductively couple the window mounting to the fuselage.

14. The system according to claim 13, wherein:
the capacitive gasket comprises an elastomeric matrix providing a seal between the window pane and the window forging.

15. The system according to claim 14, wherein:
the capacitive gasket includes a conductive media for conducting electromagnetic energy from the window pane to the window forging.

16. The system according to claim 13, wherein:
the window mounting includes an electronically dimmable window.

17. The system according to claim 16, further comprising:
a bellows seal mating the electronically dimmable window to the window mounting.

18. The system according to claim 17, wherein:
the bellows seal includes an electrically conductive coating electrically coupling the electronically dimmable window to the window mounting.

19. The system according to claim 13, wherein:
the system attenuates greater than about 20 decibels (dB) of electromagnetic (EM) energy in a frequency range of from about 380 Mega Hertz (MHz) to about 10.6 Giga Hertz (GHz).

20. An aircraft, comprising:
a fuselage providing an electrically conductive envelope;
an aperture disposed in the fuselage;
a window mounting mounted in the aperture of and conductively coupled to the fuselage, the window mounting including:
an outer window pane having an electromagnetically-reflective coating for reflecting electromagnetic energy, the outer window pane remaining electrically isolated from the fuselage prior to the electromagnetic energy exceeding a frequency of approximately 1 GHz; and
a capacitive gasket capcaitively coupling the outer window pane to the fuselage after the frequency of the electromagnetic energy reflected by the outer window pane exceeds approximately 1 GHz; and
an electronically dimmable inner window.

* * * * *